SEMICONDUCTOR DEVICE FABRICATION

Filed April 7, 1970

INVENTOR.
JOSEPH H. SCOTT, JR.
BY M. Y. Epstein
Attorney 3,745,072

SEMICONDUCTOR DEVICE FABRICATION

Joseph Hurlong Scott, Jr., Newark, N.J., assignor to RCA Corporation

Filed Apr. 7, 1970, Ser. No. 26,374
Int. Cl. H01l 7/00, 11/00
U.S. Cl. 148—175 4 Claims

ABSTRACT OF THE DISCLOSURE

A first layer of semiconductor material is provided on an insulating substrate and defined to form a first region. A masking layer is provided on the first region preferably covering all the exposed surfaces thereof. A second layer of semiconductor material, having conductivity characteristics different from that of the first layer, is formed on the first region and on the substrate. Using an etchant which does not attack the masking layer, the second layer is defined to form a second region spaced from the first region. Thereafter a component is formed within each of the two regions, the component of the first region having different electrical characteristics from the component of the second region.

BACKGROUND OF THE INVENTION

The invention herein disclosed was made in the course of or under a contract or subcontract thereunder with the Department of the Air Force.

This invention relates to semiconductor devices of the type comprising an insulating substrate and a number of semiconductor components on the substrate.

Certain types of semiconductor devices, such as integrated circuits of the "silicon-on-sapphire" type, comprise one or more extremely thin, e.g., a few microns thick, layers of semiconductor materials on an insulating substrate, the various layers containing regions of different conductivity characteristics providing a number of individual semiconductor components, e.g., transistors and diodes.

An advantage of such devices is that owing to the thinness of the semiconductor material layers and the fact that the layers are supported by a substrate of insulating material, the degree of electrical coupling among the various components is small. A problem associated with the use of the thin semiconductor layers, however, is the difficulty of providing the various regions with the particular conductivity characteristics desired of the individual semiconductor components of the device. That is, the various processing sequences heretofore used tend to interact and affect all the components on the substrate, whereby it has been difficult, in the past, to fabricate devices having closely spaced components of widely differing conductivity characteristics. Also, while a main advantage of such devices is the electrical isolation obtainable among the various components on the substrate, in some instances even more complete isolation than was heretofore available is required.

DESCRIPTION OF PREFERRED EMBODIMENTS OF THE INVENTION

Reference is made to U.S. Pat. 3,476,617, issued to P. H. Robinson, on Nov. 4, 1969. This patent describes semiconductor devices of the type with which the instant invention is related, and describes various processes having utility in the practice of the instant invention. In the patent, a process, among others, is described involving epitaxially depositing a first layer of silicon on a substrate, removing portions of the first layer to expose portions of the substrate, epitaxially depositing a second layer of silicon of different conductivity characteristics than the first layer on the remains of the first layer and on the exposed substrate portions, and removing the portions of the second layer covering the remains of the first layer, thereby providing a device comprising contiguous regions of silicon of different conductivity characteristics.

The instant invention is an improvement of the process described in said patent.

Figure 1:
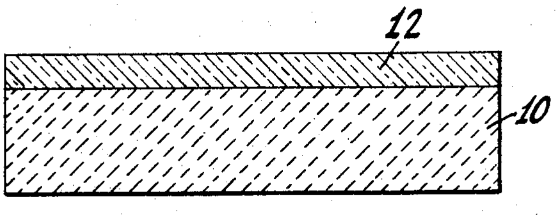
FIGS. 1 through 6 are cross-sectional views of a semiconductor wafer workpiece, the various figures illustrating a sequence of operations performed on the workpiece in accordance with the instant invention.

With reference to FIG. 1, herein, an insulating substrate 10 is shown having a first layer 12 of a semiconductor material thereon. In the instant embodiment, the substrate 10 is of monocrystalline sapphire, and the semiconductor material is an epitaxially deposited layer of monocrystalline silicon.

In general, the substrate 10 can comprise any of a number of materials on which a semiconductor material, such as silicon, germanium, silicon carbide, various III–V compounds, or the like, can be deposited. Examples of suitable substrate materials are sapphire, spinel, diamond, and silicon carbide. Although not limited thereto, the instant invention has particular utility in the fabrication of devices utilizing eptaxially deposited monocrystallne semiconductor materials, especially silicon, germanium, and gallium arsenide. With presently known techniques, the epitaxial deposition of monocrystalline layers of these materials requires the use of a monocrystalline substrate having a crystal lattice spacing similar to the crystal lattice spacing of the material being deposited, e.g., substrates of sapphire or spinel for epitaxial depositions of silicon or germanium.

Returning to a consideration of FIG. 1, the layer 12 has a particular conductivity characteristic dependent upon the particular device being fabricated. By "conductivity characteristic" is meant both the degree of conductivity and the type of conductivity, and the phrase "different conductivity characteristics," as used hereafter, encompasses both differences in the type of conductivity and differences in degrees of conductivity of the same type.

For purposes of illustration, in the instant embodiment, the layer 12 comprises 1 ohm-cm. P-type silicon having a thickness of one micron.

Means for epitaxially depositing the layer 12 are well known, an example of such means being described in the aforementioned patent.

Figure 2:
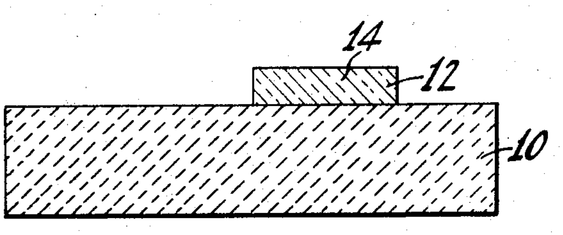

Using known photolithographic techniques, including the use of masking layers and photoresist materials, such as described in the aforementioned patent, portions of the layer 12 are removed leaving a single region 14 of P-type silicon, as shown in FIG. 2.

For convenience of illustration and description, only a single P region is shown. It will be appreciated, however, that in actual practice, a number of spaced P regions are generally formed on the substrate.

Figure 3:
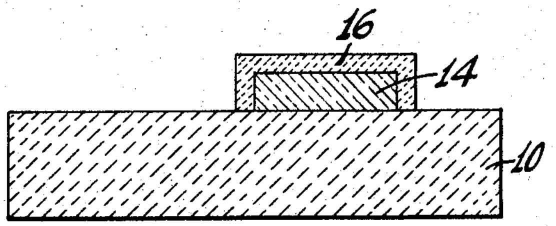

Thereafter, a masking layer 16, as shown in FIG. 3, is formed on the P region 14. In a preferred embodiment, the masking layer 16 comprises an oxide of the material of the region 14, provided, for example, by known thermal growth techniques. Using such techniques, all the exposed surfaces of the P region 14 are coated with the masking layer 16. This prevents any contact of the semiconductor material of the P region 14 with the semiconductor material layer to be subsequently deposited, as described hereinafter.

Alternatively, a masking layer, such as silicon oxide, silicon nitride, or the like, can be applied as a separate layer covering the entire substrate and the region 14, and thereafter photolithographically defined to cover only the P region 14.

Figure 4:
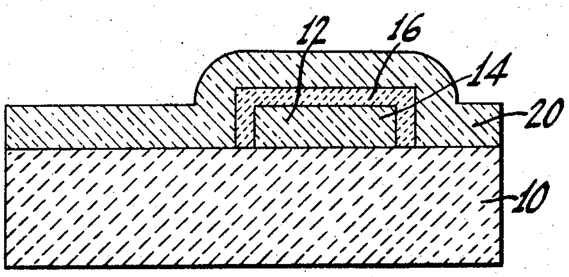

Thereafter, a second layer 20 (FIG. 4) of a semiconductor material, 2 ohm-cm. N-type monocrystalline silicon, in the instant embodiment, is epitaxially deposited on the substrate 12 including the region 14. Owing to the presence of the masking layer 16, there is no contact between the two layers 20 and 12, hence little possibility of cross-doping therebetween. Also, because the second layer 20 is provided independently of the first layer 12, the conductivity characteristics of the second layer 20, as well as the thickness thereof, can be selected independently of the conductivity characteristics of the first layer 12, and can be as desired depending upon the particular device being fabricated.

Thereafter, a second region 24 (FIG. 5) comprising N type silicon is defined using known photolithographic techniques, including an etching process to remove portions of the silicon layer 20 not protected by a defined layer of photoresist material (not shown). Preferably, an etchant is used which does not attack the material of the masking layer 16 covering the first region 14, whereby this region 14 is not disturbed by the second region defining process.

This protection of the first region 14 in the second region 24 forming step is an advantage of the instant invention over the prior art. In the process described in the aforementioned patent, for example, the second layer of silicon is deposited on top of and in direct contact with the first layer. It has been found, however, that owing to the extreme thinness of the layers used, it is somewhat difficult to remove the second layer from the first layer without simultaneously removing the first layer.

Various combinations of masking layer materials, photoresists, and etchants for practicing the above-described steps with various semiconductor materials are known.

An advantage of covering all the exposed surfaces of the first region 14 with the masking layer 16 is that, as mentioned, there is no contact between the second layer 20 and the first layer 12 along the sides of the region 14. Experience has shown that the process of completely separating two bodies of the same semiconductor material having the same or similar lattice structure is somewhat difficult with respect to reproducibility and control over the process.

Figure 5:
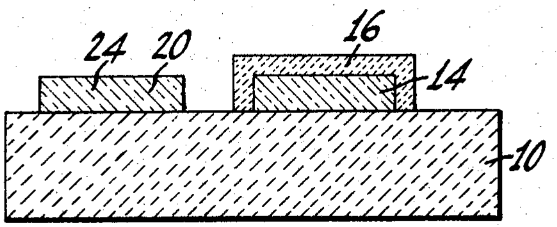

The resulting structure, comprising two regions 14 and 24, formed substantially independently of one another and spaced from one another, is shown in FIG. 5. The masking layer 16 can be removed or left in place, depending upon the particular device being fabricated.

Figure 6:
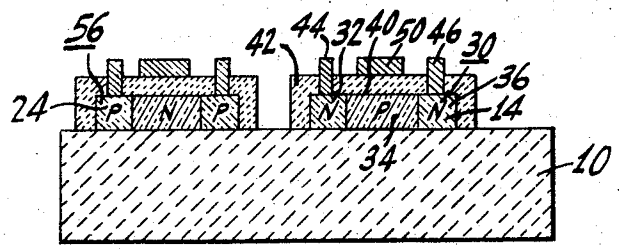

Having provided the two regions 14 and 24, a different semiconductor component is formed in each. With reference to FIG. 6, an example of one type of semiconductor component which can be formed in each region is shown, The component 30, formed in the region 14, is a P-channel field effect transistor having a source region 32 of N conductivity type, a channel region 34 of P conductivity type, and a drain region 36 of N conductivity type. Covering the surface 40 of the region 14 is an insulating layer 42 which can, although not necessarily, be the masking layer 16 originally provided on the region 14. Extending through openings through the layer 42 are a source electrode 44 connected to the source region 32, and a drain electrode 46 connected to the drain region 36. A gate electrode 50 is provided on top of the layer 42 overlying the channel region 34.

The component 56, formed in the region 24, is similar to the component 30 with the exception that the conductivity type of the various source, drain, and channel regions is the opposite of those of the component 30.

Details of the fabrication of the individual components 30 and 56, with the regions 14 and 22 as the starting point in the process, are not provided since various techniques for fabricating various semiconductor components, including components different from the components 30 and 56 shown herein, in thin films of semiconductor material are well known.

Of importance herein, however, is the fact that individual films or regions of semiconductor material can be provided on a substrate in a simple and reproducible manner, the various regions being formed independently of one another, and having the exact conductivity characteristics and thickness desired of the semiconductor components to be made therefrom. Also, while the space between the regions 14 and 24 can be filled in, preferably with an insulating material, such as silicon dioxide, or a semiconductor material including a blocking junction, in certain devices, such as that shown in FIG. 6, the space between the regions is left empty. This provides reduced electrical coupling between the semiconductor components from region to region in comparison with devices where the different conductivity characteristic regions touch one another, as shown in the aforementioned patent.

While, in the example shown, the two regions 14 and 24 are formed of the same kind of semiconductor material, different semiconductor materials for each region, e.g. silicon for one and gallium arsenide for the other, can be used. The only requirement for such usage is that each material be compatible with the substrate 10.

I claim:

1. A method of providing individual semiconductor components of differing electrical conductivity characteristics on an insulating substrate comprising:

forming a first region comprising a first layer of semiconductor material epitaxially grown on a portion of said substrate, covering all the exposed sides of said first region with a masking layer, covering said first region, said masking layer, and other portions of said substrate with an epitaxially grown second layer of semiconductor material having a conductivity characteristic different from that of said first layer, said masking layer being effective to prevent contact of said second layer with said first layer, etching portions of said second layer to provide a second region comprising a portion of said second layer on said substrate spaced from said first region, said masking layer being effective to prevent etching of said first region during etching of said second layer portions, and forming a semiconductive component within each of said regions, the component of said first region being different from the component of said second region.

2. A method as in claim 1 wherein said second layer is provided with a thickness different from the thickness of said first layer.

3. A method as in claim 1 wherein said second layer is formed of a material different from the material of said first layer.

4. A method of providing individual semiconductor components of differing electrical conductivity characteristics on an insulating substrate comprising:

epitaxially growing a first layer of silicon on a surface of said substrate, etching portions of said first layer to provide a first region of silicon, thermally oxidizing said first region to provide a covering layer of silicon dioxide thereover, pyrolytically depositing a second layer of silicon having a conductivity characteristic differing from that of said first layer on said covered first region and other portions of said substrate, said second layer being in epitaxial relation with the surface of said substrate, etching portions of said second layer to provide a second region of silicon on said substrate spaced from said first region, and forming a semiconductor component within each of said regions, the component of said first region being different from the component of said second region.

References Cited

UNITED STATES PATENTS

| | | | |
|---|---|---|---|
| 3,614,661 | 10/1971 | Borner et al. | 317—235 |
| 3,636,418 | 1/1972 | Burns et al. | 317—235 |
| 3,461,003 | 8/1969 | Jackson | 148—175 |
| 3,496,037 | 2/1970 | Jackson et al. | 148—175 |
| 3,409,812 | 11/1968 | Zuleeg | 317—235 |
| 3,424,955 | 1/1969 | Seiter et al. | 317—234 |
| 3,433,686 | 3/1969 | Marinace | 148—175 |
| 3,484,662 | 12/1969 | Hagon | 317—235 |

FOREIGN PATENTS

| | | | |
|---|---|---|---|
| 1,173,911 | 12/1969 | Great Britain | 317—234 |
| 1,160,744 | 8/1969 | Great Britain | 317—234 |

OTHER REFERENCES

Allison et al.: "Thin-Film Silicon: Preparation . . . Applications," Proc. IEEE, vol. 57, No. 9, September 1969, pp. 1490–1498.

Christiansen, D.: "A Challenge to Integrate and Isolate," Electronics, Mar. 20, 1967, pp. 91–92.

Stoller et al.: "IC Isolation: Options Offered," Electronics, Mar. 20, 1967, pp. 93–105.

L. DEWAYNE RUTLEDGE, Primary Examiner

W. G. SABA, Assistant Examiner

U.S. Cl. X.R.

29—580, 583; 117—201, 212, 215; 148—174; 317—101, 235 R